US 10,164,586 B2

(12) United States Patent
Li et al.

(10) Patent No.: US 10,164,586 B2
(45) Date of Patent: Dec. 25, 2018

(54) IMPEDANCE-MATCHING CIRCUIT

(71) Applicant: NXP USA, INC., Austin, TX (US)

(72) Inventors: Wenming Li, Chengdu (CN); Yunfei Wang, Chengdu (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/679,046

(22) Filed: Aug. 16, 2017

(65) Prior Publication Data

US 2018/0138871 A1   May 17, 2018

(30) Foreign Application Priority Data

Nov. 16, 2016   (CN) .......................... 2016 1 1033624

(51) Int. Cl.
*H03F 3/191*   (2006.01)
*H03F 1/56*   (2006.01)
*H03F 3/195*   (2006.01)
*H03F 3/213*   (2006.01)
*H03H 7/01*   (2006.01)
*H03H 7/38*   (2006.01)

(52) U.S. Cl.
CPC ............ *H03F 1/565* (2013.01); *H03F 3/195* (2013.01); *H03F 3/213* (2013.01); *H03H 7/1758* (2013.01); *H03H 7/1775* (2013.01); *H03H 7/38* (2013.01); *H03F 2200/387* (2013.01); *H03F 2200/391* (2013.01); *H03F 2200/451* (2013.01)

(58) Field of Classification Search
CPC .......... H03F 3/191; H03F 3/193; H03F 3/195; H03F 1/565
USPC ...................................... 330/302; 333/32, 33
See application file for complete search history.

(56) References Cited

U.S. PATENT DOCUMENTS

| | | |
|---|---|---|
| 7,411,458 B2 | 8/2008 | Frei et al. |
| 7,710,204 B2 | 5/2010 | Karoui et al. |
| 8,258,876 B1 | 9/2012 | Osika et al. |
| 9,571,044 B1 * | 2/2017 | Zhu ........................ H03F 1/565 |

* cited by examiner

*Primary Examiner* — Steven J Mottola
(74) *Attorney, Agent, or Firm* — Charles E. Bergere

(57) ABSTRACT

An impedance-matching circuit includes a resonant circuit, first and second capacitors, and first through third inductive circuits. The resonant circuit includes a fourth inductive circuit connected in parallel with a capacitive circuit. The impedance-matching circuit receives a radio frequency power amplifier (RFPA) output signal, which includes first and second signals at first and second frequencies, respectively. A resonant frequency of the resonant circuit is between the first and second frequencies. The resonant circuit offers inductive and capacitive impedances to the first and second signals, respectively. The impedance-matching circuit generates a matched RFPA output signal including the first signal and the second signal, where the second signal is at a reduced voltage level.

13 Claims, 2 Drawing Sheets

IMPEDANCE-MATCHING CIRCUIT

BACKGROUND

The present invention relates generally to integrated circuits (ICs), and more particularly, to impedance-matching circuits.

An integrated circuit (IC) includes multiple source circuits that drive corresponding sets of load circuits, transferring power to the load circuits. To improve efficiency of the operation of the IC, maximum power should be transferred from a source circuit to the corresponding load circuits. It is generally understood that maximum power is transferred from the source circuit to the corresponding load circuits when the output impedance of the source circuit matches the input impedance of the load circuits. A mismatch between the output and input impedances results in a reduction of the power transferred to the load circuits, which in turn leads to a leakage of power to other components of the IC.

A source circuit such as a radio frequency power amplifier (RFPA), which drives at least one load circuit such as an antenna, operates at a very high frequency. At high frequencies, a mismatch between an output impedance of the RFPA and an input impedance of the load circuit(s) results in a greater reduction in the power transferred from the RFPA to the load circuit(s) as compared to the reduction in the transferred power from a source circuit operating at a low frequency. This reduction in the transferred power leads to a greater leakage of the power to the RFPA and other components of the IC, which can damage the RFPA as well as the other components. Hence, an impedance-matching circuit is needed to accurately match the output impedance of the RFPA with the input impedance of the load circuit(s).

The impedance-matching circuit is connected between the RFPA and the load circuit(s). The impedance-matching circuit includes at least one inductor-capacitor (LC) filter that includes an inductor and a capacitor connected in series with each other. The LC filter is connected in parallel with the RFPA. The output impedance of the RFPA is based on an impedance of the LC filter. The impedance of the LC filter is determined in such a way that the output impedance matches the input impedance of the load circuit(s).

Typically, the RFPA includes multiple transistors, at least one of which operates at a fundamental frequency and outputs an RFPA output signal that is amplified at the fundamental frequency. During amplification of the RFPA output signal, the RFPA introduces a nonlinear distortion in the RFPA output signal. Further, asymmetric fabrication of the transistors may introduce corresponding delays in generation of the RFPA output signal. The nonlinear distortion and delays lead to an introduction of spurious harmonic frequencies (i.e., integral multiples of the fundamental frequency) in the RFPA output signal. Typically, the output impedance of the RFPA is based on the fundamental frequency. However, due to the introduction of these spurious harmonic frequencies, the output impedance of the RFPA is affected by the harmonic frequencies, causing the output impedance to fluctuate, leading to a mismatch between the output impedance and the input impedance of the load circuit(s).

It is desirable that a voltage level of the RFPA output signal is equal to a voltage level corresponding to the fundamental frequency. However, due to a constructive interference in signals of the RFPA output signal at the harmonics frequencies, the voltage level of the RFPA output signal equals a sum of voltage levels corresponding to harmonic frequencies and the fundamental frequency, which results in an increase in the voltage level of the RFPA output signal. Thus, the RFPA may not accurately output the RFPA output signal at the desired voltage level. Furthermore, the increase in the voltage level of the RFPA output signal stresses the RFPA transistors, which can damage the transistors (i.e., decreases the ruggedness of the RFPA).

One way to prevent these problems is to include at least one resistor-capacitor (RC) filter in the impedance-matching circuit. The RC filter is connected in cascade with the RFPA. The output impedance of the RFPA is based on an impedance of the RC filter. The impedance of the RC filter is such that the output impedance matches the input impedance of the load circuit(s). Further, the RC filter filters the RFPA output signal and reduces a voltage level at each of the harmonic frequencies of the RFPA output signal, which reduces the voltage stress on the transistors. However, since the RC filter is connected in cascade with the RFPA, a voltage level of the fundamental frequency also is modified, which is not desirable. Further, the inclusion of multiple RC filters for multiple harmonic frequencies increases the complexity of the impedance-matching circuit.

It would be advantageous to have an impedance-matching circuit that reduces a voltage level corresponding to at least one harmonic frequency of an RFPA output signal and does not change the voltage level of a fundamental frequency of the RFPA output signal.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
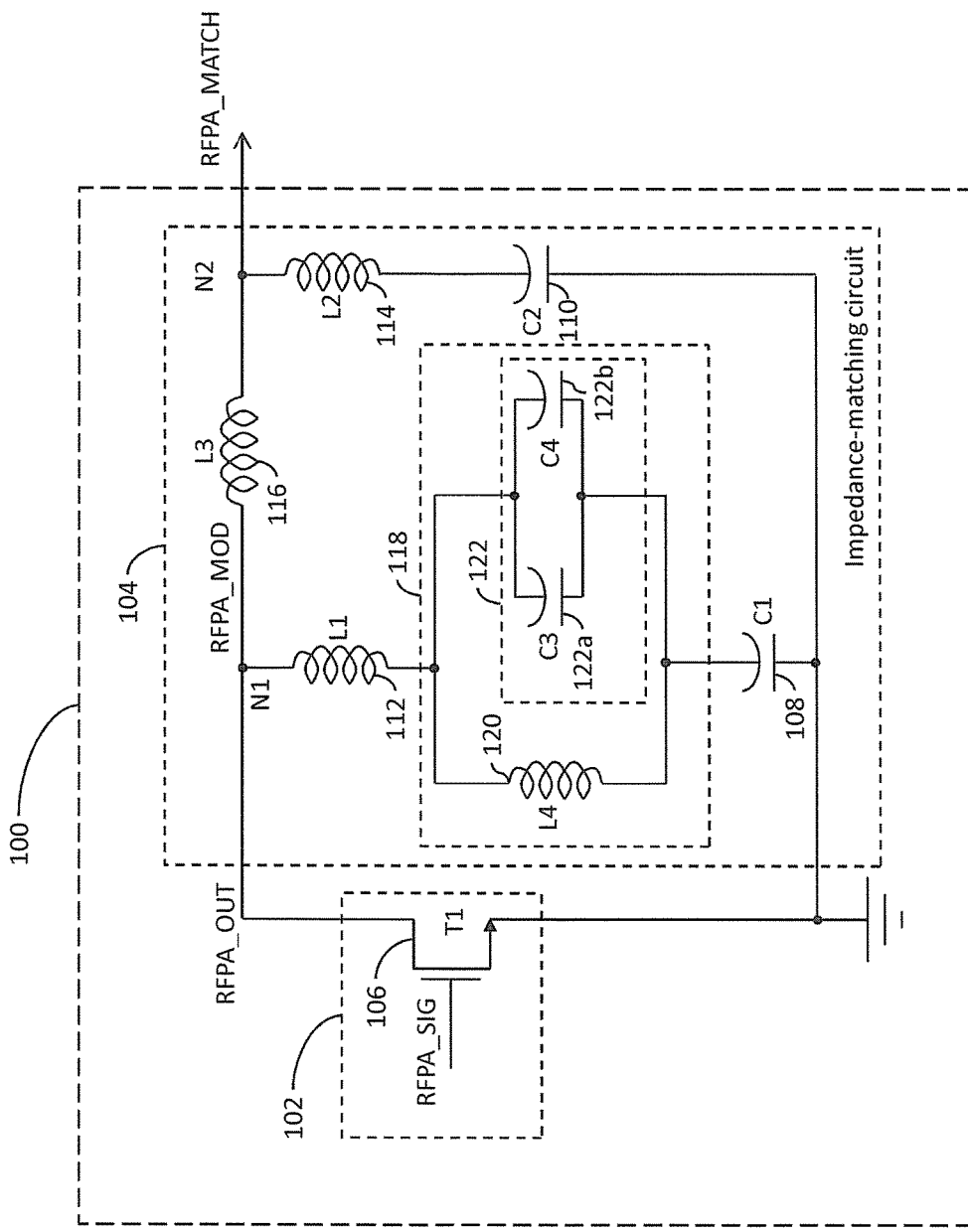
FIG. 1 is a schematic circuit diagram of an integrated circuit (IC) that includes an impedance-matching circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides an impedance-matching circuit. The impedance-matching circuit is connected to a transistor of a radio frequency power amplifier (RFPA) for receiving an RFPA output signal. The RFPA output signal includes first and second signals at first and second frequencies, respectively. The impedance-matching circuit includes a resonant circuit and first and second capacitors. The resonant circuit is connected to a first node of the impedance-matching circuit by way of a first inductive circuit. The resonant circuit receives the RFPA output signal, modifies the RFPA output signal based on an impedance of the resonant circuit, and generates a modified RFPA output signal. A resonant frequency of the resonant circuit is greater than the first frequency and less than the second frequency. The impedance of the resonant circuit is based on the resonant, first, and second frequencies. The first capacitor is connected between the resonant circuit and ground. The second capacitor is connected between a second node of the impedance-matching circuit and ground. The second capacitor and the first node are connected to the second node by way of second and third inductive circuits, respectively, to output a matched RFPA output signal at the second node based on the modified RFPA output signal.

In another embodiment, the present invention provides an integrated circuit (IC) that includes a RFPA and an impedance-matching circuit. The RFPA generates an RFPA signal and includes a transistor to generate an RFPA output signal based on the RFPA signal. The RFPA output signal includes first and second signals at first and second frequencies, respectively. The impedance-matching circuit includes a resonant circuit and first and second capacitors. The impedance-matching circuit is connected to the transistor to receive the RFPA output signal at a first node thereof. The impedance-matching circuit outputs a matched RFPA output signal at a second node thereof. The resonant circuit is connected to the first node by way of a first inductive circuit. The resonant circuit receives the RFPA output signal, modifies the RFPA output signal based on an impedance of the resonant circuit, and generates a modified RFPA output signal. A resonant frequency of the resonant circuit is greater than the first frequency and less than the second frequency. The impedance of the resonant circuit is based on the resonant, first, and second frequencies. The first capacitor is connected between the resonant circuit and ground, and the second capacitor is connected between the second node and ground. The second capacitor and the first node are connected to the second node by way of second and third inductive circuits, respectively, to output the matched RFPA output signal at the second node based on the modified RFPA output signal.

Various embodiments of the present invention provide an impedance-matching circuit that includes a resonant circuit, first and second capacitors, and first through third inductive circuits. The impedance-matching circuit receives an RFPA output signal at a first node from an RFPA. The RFPA output signal includes first and second signals at first and second frequencies, respectively. The first node is connected to a second node by way of the third inductive circuit. The resonant circuit and the second capacitor are connected to the first and second nodes by way of the first and second inductive circuits, respectively. The first and second capacitors are connected to the resonant circuit and the second node, respectively, and to ground. The first resonant circuit includes a fourth inductive circuit and a capacitive circuit. A resonant frequency of the resonant circuit is greater than the first frequency, and less than the second frequency. Hence, the resonant circuit offers an inductive impedance to the first signal and a capacitive impedance to the second signal. Thus, the impedance-matching circuit outputs a matched RFPA output signal, which includes the first and second signals at the first and second frequencies, respectively, such that a voltage level of the first signal is unchanged and a voltage level of the second signal is reduced.

Thus, the impedance-matching circuit of the present invention prevents a modification of an output impedance of the RFPA at the first signal and modifies the output impedance of the RFPA at the second signal. Thus, the impedance-matching circuit ensures that the RFPA accurately outputs the RFPA output signal at a desired voltage level of the first signal and suppresses a voltage level of the second signal. A decrease in the voltage level of the second signal leads to a decrease in a voltage overstress for the RFPA, protecting the RFPA from damage (i.e., increasing a ruggedness of the RFPA).

Referring now to FIG. 1, a schematic circuit diagram of an integrated circuit (IC) 100 in accordance with an embodiment of the present invention is shown. The IC 100 includes a radio frequency power amplifier (RFPA) 102 and an impedance-matching circuit 104. The RFPA 102 includes multiple transistors—one of which is shown—a transistor 106. The RFPA 102 generates an RFPA output signal RFPA_OUT that includes first and second signals at first and second frequencies, respectively. In the presently preferred embodiment, the first and second frequencies are a fundamental frequency and a second harmonic frequency, respectively, where the second harmonic frequency is a second multiple of the fundamental frequency. The impedance-matching circuit 104 receives the RFPA output signal RFPA_OUT, suppresses a voltage level of the second signal corresponding to the second harmonic frequency, and outputs a matched RFPA output signal RFPA_MATCH. The impedance-matching circuit 104 includes first and second capacitors 108 and 110, first through third inductive circuits 112-116, and a resonant circuit 118.

The RFPA 102 internally generates an RFPA signal called RFPA_signal. The transistor 106 has a gate that receives the signal RFPA_signal. The transistor 106 also has a source connected to ground GND and a drain that provides the RFPA output signal called RFPA_OUT. The transistor 106 may be at least one of a p-channel metal oxide semiconductor field effect transistor (PMOS), an n-channel metal oxide semiconductor field effect transistor (NMOS), a laterally diffused MOSFET (LDMOS), a high-electron-mobility transistor (HEMT), and the like. In one embodiment, the transistor 106 is an LDMOS transistor.

The impedance-matching circuit 104 receives the RFPA output signal RFPA_OUT at a first node N1. The resonant circuit 118 is connected to the first node N1 and ground GND by way of the first inductive circuit 112 and the first capacitor 108, respectively. The resonant circuit 118 includes a fourth inductive circuit 120 and a capacitive circuit 122. The capacitive circuit 122 includes a set of capacitors—two of which are shown—third and fourth capacitors 122a and 122b. The fourth inductive circuit 120 and the third and fourth capacitors 122a and 122b are all connected in parallel. An angular resonant frequency ($\omega_R$) and a resonant frequency ($f_R$) of the resonant circuit 118 are based on an inductance ($L_4$) of the fourth inductive circuit 120 and a capacitance ($C_3$ and $C_4$) of each of the third and fourth capacitors 122a and 122b. The angular resonant frequency ($\omega_R$) and the resonant frequency ($f_R$) are defined by the following equations:

$$\omega_R = 1/(L_4*(C_3+C_4))^{(1/2)} \qquad (1)$$

$$f_R = \omega_R/(2*\pi) \qquad (2)$$

The resonant frequency ($f_R$) of the resonant circuit 118 is less than the second harmonic frequency and greater than the fundamental frequency. The resonant circuit 118 offers an inductive impedance to a signal at a frequency that is less than the resonant frequency ($f_R$). Further, the resonant circuit 118 offers a capacitive impedance to a signal at a frequency that is greater than the resonant frequency ($f_R$).

The first node N1 also is connected to a second node N2 of the impedance-matching circuit 104 by way of the third inductive circuit 116. The second capacitor 110 has a first terminal connected to the second node by way of the second inductive circuit 114, and a second terminal connected to ground GND. That is, the second inductive circuit 114 and the second capacitor 110 are connected in series between the second node N2 and GND. The impedance-matching circuit 104 outputs the matched RFPA output signal RFPA_MATCH at the second node N2.

In operation, the RFPA 102 generates the RFPA output signal RFPA_OUT. The RFPA output signal RFPA_OUT includes the first and second signals at the fundamental frequency and the second harmonic frequency. In one embodiment, the RFPA 102 operates at 1.8 Giga Hertz (GHz) (i.e., the fundamental frequency of the RFPA output signal RFPA_OUT is 1.8 GHz). Hence, the second harmonic frequency is 3.6 GHz and the resonant frequency is between 1.8 GHz and 3.6 GHz. For example, if the resonant frequency is 2.5 GHz (i.e., ($f_R$) is equal to 2.5 GHz), a capacitance of the capacitive circuit 122 (i.e., a sum of the capacitances ($C_3$ and $C_4$) of the third and fourth capacitors 122a and 122b) and the inductance ($L_4$) of the fourth inductive circuit 120 are approximately 10 picoFarads (pF) and 400 picoHenries (pH), respectively. When the RFPA 102 operates at 1.8 GHz, the capacitances ($C_1$ and $C_2$) of the first and second capacitors 108 and 110 are 100 pF and 6 pF, respectively, and an inductance ($L_1$, $L_2$, and $L_3$) of each of the first through third inductive circuits 112-116 is 400 pH.

The impedance-matching circuit 104 receives the RFPA output signal RFPA_OUT at the first node N1. The impedance-matching circuit 104 modifies the RFPA output signal RFPA_OUT based on an impedance (Z) offered by the first inductive circuit 112, the resonant circuit 118, and the first capacitor 108. The resonant circuit 118 outputs a modified RFPA output signal RFPA_MOD at the first node N1. The modified RFPA output signal RFPA_MOD includes modified first and second signals. The impedance (Z) offered by the first inductive circuit 112, the resonant circuit 118, and the first capacitor 108 to the RFPA output signal RFPA_OUT at the first node N1 is defined by the following equation:

$$Z = (j*((\omega^2 * L_1 * C_1) - 1)/(\omega * C_1)) + ((j*\omega/(C_3 + C_4)) * (1/(\omega_R^2 - \omega^2))) \quad (3)$$

In the equation (3), ω is an angular frequency of at least one of the first and second signals of the RFPA output signal RFPA_OUT. A frequency corresponding to the angular frequency ω of the at least one of the first and second signals of the RFPA output signal RFPA_OUT is defined by the following equation:

$$f = \omega/(2*\pi) \quad (4)$$

When the first frequency is equal to 1.8 GHz (i.e., f is equal to 1.8 GHz), corresponding angular frequency (ω)) is calculated using equation (4). When the angular frequency (ω)), the inductance ($L_1$) of the first inductive circuit 112, the capacitances ($C_1$, $C_3$, and $C_4$) of the first, third, and fourth capacitors 108, 122a, and 122b, and the resonant frequency ($\omega_R$) are substituted in equations (1), (2), and (3), a value of the impedance (Z) is calculated to be approximately equal to j13 ohms. Thus, the first inductive circuit 112, the resonant circuit 118, and the first capacitor 108 offer an inductive impedance to the fundamental frequency of the RFPA output signal RFPA_OUT, thereby offering the first signal, a high impedance path to ground GND. The inductive impedance matches a complex-conjugate of an output impedance of the RFPA 102 for the first signal at the first frequency. The maximum power-transfer theorem, which is well-known to a person skilled in the art, states that maximum power is transferred from a source circuit to a load circuit when an output impedance of the source circuit matches a complex-conjugate of an input impedance of the load circuit. Thus, a transfer of maximum power corresponding to the first signal is ensured between the RFPA 102 (i.e., the source circuit) and the impedance-matching circuit 104 (i.e., the load circuit). Hence, the voltage level of the first signal of the RFPA output signal RFPA_OUT is not modified when the first signal is output as the modified first signal.

Further, when the second frequency is equal to 3.6 GHz (i.e., f is equal to 3.6 GHz), corresponding angular frequency (ω) is calculated using equation (4). The value of the impedance (Z) is calculated to be approximately equal to −j5 ohms. Thus, the first inductive circuit 112, the resonant circuit 118, and the first capacitor 108 offer a capacitive impedance to the second harmonic frequency of the RFPA output signal RFPA_OUT, thereby offering the second signal, a low impedance path to ground GND. Further, the capacitive impedance does not match the complex-conjugate of the output impedance of the RFPA 102 for the second signal at the second frequency. Hence, a power, which is less than a maximum power corresponding to the second signal, is transferred from the RFPA 102 to the impedance-matching circuit 104. Hence, the voltage level of the second signal of the RFPA output signal RFPA_OUT is reduced when the second signal is output as the modified second signal. Thus, the modified RFPA output signal RFPA_MOD includes the modified first and the second signals.

The second capacitor 110 and the second inductive circuit 114 offer a capacitive impedance for the modified first signal at the fundamental frequency and an inductive impedance for the modified second signal at the second harmonic frequency. Further, the second capacitor 110 and the second inductive circuit 114 output a matched RFPA output signal RFPA_MATCH at the second node N2. Thus, the impedance-matching circuit 104 outputs the matched RFPA output signal RFPA_MATCH.

Figure 2A:
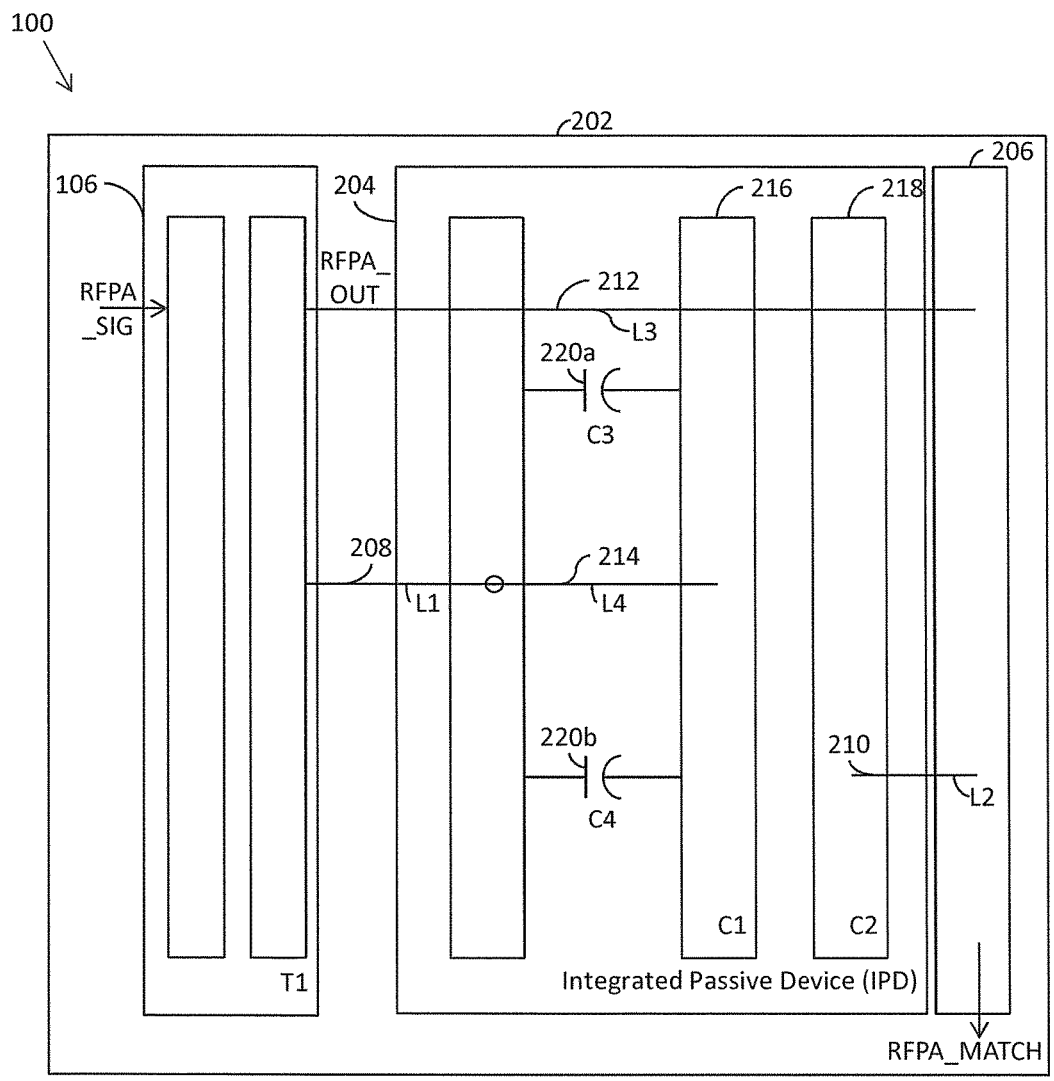
FIGS. 2A and 2B are top and side views, respectively, of the impedance-matching circuit of FIG. 1 in accordance with an embodiment of the present invention.
Figure 2B:
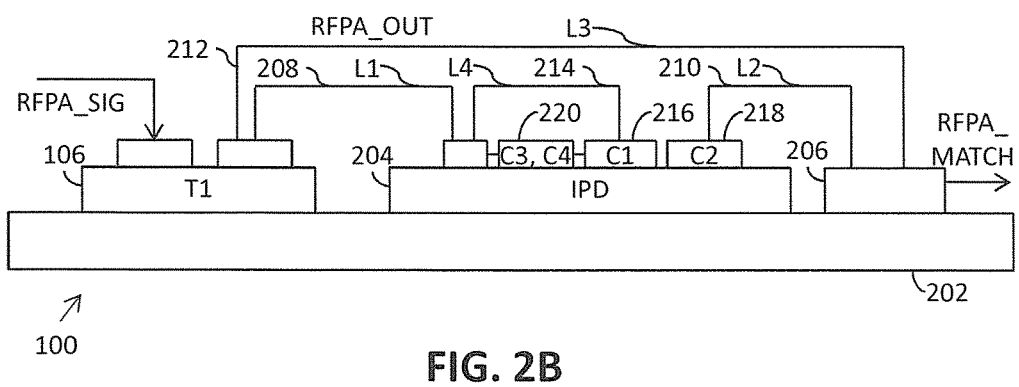

Referring now to FIGS. 2A and 2B, top and side views of the impedance-matching circuit 104 and transistor 106 of FIG. 1, respectively, in accordance with an embodiment of the present invention are shown. During the fabrication of the IC 100, the impedance-matching circuit 104 and the transistor 106 are formed on a substrate 202. In the presently preferred embodiment, the RFPA output signal RFPA_OUT includes at least one frequency in radio frequency (RF) range (i.e., from 3 kilo Hertz (kHz) to 300 GHz). Since an efficiency of a discrete surface-mount device (SMD) (not shown) such as a discrete capacitor and a discrete inductor decreases when the discrete SMD receives a signal at a frequency in the RF range, it is undesirable to implement the impedance-matching circuit 104 using a set of discreet SMDs. Hence, the implementation of the impedance-matching circuit 104 includes an integrated passive device (IPD) 204 and at least one connection pad 206 on the substrate 202. Further, the first through fourth inductive circuits 112-116 and 120 are implemented using first through fourth bond wires 208-214, respectively. It will be understood by a person skilled in the art that each of the first through fourth inductive circuits 112-116 and 120 may be implemented using more than one bond wire. The first through fourth capacitors 108, 110, 122a, and 122b are implemented on the IPD 204.

In one embodiment, the first through fourth capacitors 108, 110, 122a, and 122b are first through fourth trench capacitors 216, 218, 220a, and 220b, respectively, formed on the IPD 204. The third and fourth trench capacitors 220a and 220b are collectively referred to as a trench capacitive circuit 220 in FIG. 2B. In another embodiment, the first through fourth capacitors 108, 110, 122a, and 122b are first through fourth metal-insulator-metal capacitors (MIM) 216, 218, 220a, and 220b, respectively, formed on the IPD 204. The third and fourth MIM capacitors 220a and 220b are collectively referred to as an MIM capacitive circuit 220 in FIG. 2B. Methods of forming both MIM and trench capacitors are known to those of skill in the art.

Since the capacitive circuit 122 of the resonant circuit 118 includes the third and fourth capacitors 122a and 122b connected in parallel, a current corresponding to the RFPA output signal RFPA_OUT is equally divided into first and second currents corresponding to the third and fourth capacitors 122a and 122b. This prevents damage to the capacitive circuit 112 when the current corresponding to the RFPA output signal RFPA_OUT increases. Although the RFPA output signal RFPA_OUT may include higher harmonic frequencies such as third, fourth harmonic frequencies, and the like, the voltage level of the second signal corresponding to the second harmonic frequency is greater than voltage levels corresponding to the higher harmonic frequencies. The impedance-matching circuit 104 reduces the voltage level of only the second signal. Hence, the impedance-matching circuit 104 of the presently preferred embodiment does not include additional circuits to reduce the voltage levels corresponding to the higher harmonic frequencies. This prevents a significant increase in the complexity of the impedance-matching circuit 104. Further, the impedance-matching circuit 104 does not modify the voltage level of the first signal and reduces the voltage level of the second signal. Thus, an output impedance of the RFPA 102 is significantly based only on the fundamental frequency corresponding to the first signal. Thus, the impedance-matching circuit 104 reduces a modification in the output impedance of the RFPA 102 due to the second signal of the RFPA output signal RFPA_OUT. Thus, the impedance-matching circuit 104 ensures that an accurate voltage level of the RFPA output signal RFPA_OUT is output from the RFPA 102 as the matched RFPA output signal RFPA_MATCH.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An impedance-matching circuit connected to a radio frequency power amplifier (RFPA) for receiving an RFPA output signal, wherein the RFPA output signal includes first and second signals at first and second frequencies, respectively, the impedance-matching circuit comprising:
  a resonant circuit connected to a first node by way of a first inductive circuit, wherein the resonant circuit receives the RFPA output signal by way of the first node and the first inductive circuit, modifies the RFPA output signal based on an impedance of the resonant circuit, and generates a modified RFPA output signal, wherein a resonant frequency of the resonant circuit is greater than the first frequency and less than the second frequency, and the impedance of the resonant circuit is based on the resonant, first, and second frequencies;
  a first capacitor connected between the resonant circuit and ground;
  a second capacitor connected between a second node of the impedance-matching circuit and ground;
  a second inductive circuit connected between the second node and the second capacitor; and
  a third inductive circuit connected between the first node and the second node, and wherein the impedance matching circuit outputs a matched RFPA output signal at the second node based on the modified RFPA output signal, and
  wherein the resonant circuit includes:
    a capacitive circuit connected between the first inductive circuit and the first capacitor; and
    a fourth inductive circuit connected in series between the first inductive circuit and the first capacitor, and in parallel with the capacitive circuit.

2. The impedance-matching circuit of claim 1, wherein the capacitive circuit comprises third and fourth capacitors connected in parallel with each other.

3. The impedance-matching circuit of claim 1, wherein the first through fourth inductive circuits include first through fourth bond wires.

4. The impedance-matching circuit of claim 1, wherein the first through fourth capacitors are formed on an integrated passive device (IPD).

5. The impedance-matching circuit of claim 1, wherein the first and second frequencies are equal to a fundamental frequency of the RFPA and a second harmonic frequency, respectively, and wherein the second harmonic frequency is equal to twice the fundamental frequency.

6. An integrated circuit (IC), comprising:
  a radio frequency power amplifier (RFPA) that generates an RFPA output signal, wherein the RFPA output signal includes first and second signals at first and second frequencies, respectively; and
  an impedance-matching circuit that is connected to the RFPA to receive the RFPA output signal at a first node thereof, and that outputs a matched RFPA output signal at a second node thereof, wherein the impedance-matching circuit comprises:
  a resonant circuit that is connected to the first node by way of a first inductive circuit, receives the RFPA output signal, modifies the RFPA output signal based on an impedance of the resonant circuit, and generates a modified RFPA output signal, wherein a resonant frequency of the resonant circuit is greater than the first frequency and less than the second frequency, and the impedance of the resonant circuit is based on the resonant, first, and second frequencies;
  a first capacitor connected between the resonant circuit and ground; and
  a second capacitor connected between the second node and ground, wherein the second capacitor and the first node are connected to the second node by way of second and third inductive circuits, respectively, to output the matched RFPA output signal at the second node based on the modified RFPA output signal, and
  wherein the resonant circuit includes:
    a capacitive circuit connected between the first inductive circuit and the first capacitor; and
    a fourth inductive circuit connected between the first inductive circuit and the first capacitor, wherein the capacitive circuit is connected in parallel with the fourth inductive circuit.

7. The IC of claim 6, wherein the capacitive circuit includes a set of capacitors including third and fourth capacitors, and wherein the third capacitor is connected in parallel, with the fourth capacitor.

8. The IC of claim 6, wherein the first through fourth inductive circuits include first through fourth bond wires.

9. The IC of claim 6, wherein the first through fourth capacitors are formed on an integrated passive device (IPD).

10. The IC of claim 6, wherein the first and second frequencies are equal to a fundamental frequency of the RFPA and a second harmonic frequency, respectively, and wherein the second harmonic frequency is equal to twice the fundamental frequency.

11. An integrated circuit (IC), comprising:

a radio frequency power amplifier (RFPA) that generates an RFPA output signal, wherein the RFPA output signal includes first and second signals at first and second frequencies, respectively; and an impedance-matching circuit connected to the RFPA to receive the RFPA output signal at a first node thereof, wherein the impedance-matching circuit outputs a matched RFPA output signal at a second node thereof, wherein the impedance-matching circuit comprises:

a first inductor having a first terminal connected to the first node;

a resonant circuit connected to the second terminal of the first inductor, wherein the resonant circuit receives the RFPA, output signal, modifies the RFPA output signal based on an impedance of the resonant circuit, and generates a modified RFPA output signal, and wherein a resonant frequency of the resonant circuit is greater than the first frequency and less than the second frequency, and the impedance of the resonant circuit is based on the resonant, first, and second frequencies;

a first capacitor connected between the resonant circuit and ground;

a second inductor and a second capacitor connected in series between the second node and ground; and a third inductor connected between the first node and the second node, wherein the matched RFPA output signal is provided at the second node, and wherein the resonant circuit comprises:

a fourth inductor connected in series between the first inductor and the first capacitor; and third and fourth capacitors connected in parallel with each other, and in parallel with the fourth inductor between the first inductor and the first capacitor.

12. The IC of claim 11, wherein RFPA comprises a transistor having a gate that receives an RFPA input signal, a source connected to ground, and a drain connected to the first node of the impedance matching circuit, wherein the RFPA output signal is provided at said drain.

13. The IC of claim 11, wherein the first through fourth inductors comprise bond wires.

\* \* \* \* \*